(12) United States Patent
Tzeng et al.

(10) Patent No.: US 6,670,664 B1
(45) Date of Patent: Dec. 30, 2003

(54) SINGLE TRANSISTOR RANDOM ACCESS MEMORY (1T-RAM) CELL WITH DUAL THRESHOLD VOLTAGES

(75) Inventors: Kuo-Chyuan Tzeng, Hsin-chu (TW); Dennis J. Sinitsky, Hsin-chu (TW); Chen-Jong Wang, Hsin-chu (TW); Wen-Chaun Chiang, Hsin-chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/279,809

(22) Filed: Oct. 22, 2002

(51) Int. Cl.[7] .............................................. H01L 27/108
(52) U.S. Cl. ....................................... 257/296; 257/285
(58) Field of Search .................................. 257/296, 285

(56) References Cited

U.S. PATENT DOCUMENTS

| 5,672,521 | A | 9/1997 | Barsan et al. | |
|---|---|---|---|---|
| 5,918,133 | A | 6/1999 | Gardner et al. | 438/299 |
| 6,091,109 | A | 7/2000 | Hasegawa | 257/339 |
| 6,573,548 | B2 * | 6/2003 | Leung et al. | 257/296 |

* cited by examiner

*Primary Examiner*—David Nelms
*Assistant Examiner*—Tu-Tu Ho
(74) *Attorney, Agent, or Firm*—Tung & Associates

(57) ABSTRACT

A random access memory cell and a method for fabrication thereof provide a field effect transistor device laterally adjoining a metal oxide semiconductor capacitor device, each formed within an active region of a semiconductor substrate. Within the random access memory cell and method: (1) a single fluorinated silicon oxide layer of a single thickness serves as both a gate dielectric layer within the field effect transistor device and a capacitor dielectric layer within the metal oxide semiconductor capacitor device; and (2) a channel region within the field effect transistor device has a different threshold voltage adjusting dopant concentration in comparison with a semiconductor plate region within the metal oxide semiconductor capacitor device. The random access memory cell is fabricated with enhanced performance.

10 Claims, 1 Drawing Sheet

SINGLE TRANSISTOR RANDOM ACCESS MEMORY (1T-RAM) CELL WITH DUAL THRESHOLD VOLTAGES

BACKGROUND OF THE INVENTION

1. Field of the Invention

The present invention relates generally to single transistor random access memory (1T-RAM) cell structures. More particularly, the present invention relates-to single transistor random access memory cell structures with enhanced performance.

2. Description of the Related Art

Common in the semiconductor product fabrication art is the fabrication of single transistor random access memory cell structures. A single transistor random access memory cell structure typically comprise a transistor as a switching device connected with a capacitor as a digital data storage device. Access to digital data stored within the capacitor is effected by switching operation of the transistor.

While single transistor random access memory cell structures are quite common in the semiconductor product fabrication art and often essential in the semiconductor product fabrication art, single transistor random access memory cell structures are nonetheless not entirely without problems.

In that regard, it is often difficult to fabricate single transistor random access memory cell structures with enhanced performance with respect to both transistors and capacitors formed therein.

It is towards the foregoing object that the present invention is directed.

Various semiconductor products having desirable properties, and methods for fabrication thereof, have been disclosed within the semiconductor product fabrication art.

Included but not limiting among the semiconductor products and methods for fabrication thereof are semiconductor products and methods for fabrication thereof disclosed within: (1) Barsan et al., in U.S. Pat. No. 5,672,521 (a method for fabricating a semiconductor substrate such as to provide multiple gate oxide layers of multiple thicknesses formed thereupon); (2) Gardner et al., in U.S. Pat. No. 5,918,133 (a method for fabricating a semiconductor device having a gate dielectric layer having two different thickness regions); and (3) Hasegawa, in U.S. Pat. No. 6,091,109 (another method for fabricating a semiconductor substrate such as to provide multiple gate oxide layers of multiple thicknesses formed thereupon).

The teachings of each of the foregoing references are incorporated herein fully by reference.

Desirable are additional single transistor random access memory cell structures with enhanced performance.

It is towards the foregoing object that the present invention is directed.

SUMMARY OF THE INVENTION

A first object of the invention is to provide a single transistor random access memory cell structure.

A second object of the invention is to provide a single transistor random access memory cell structure in accord with the first object of the invention, wherein the single transistor random access memory cell structure has enhanced performance.

In accord with the objects of the invention, the invention provides a single transistor random access memory cell structure and a method for fabricating the single transistor random access memory cell structure.

In accord with the invention, the single transistor random access memory cell structure comprises a semiconductor substrate having a minimum of one active region defined therein. The single transistor random access memory cell structure also comprises a field effect transistor device laterally adjoining a metal oxide semiconductor capacitor device, each formed within the minimum of one active region. Within the single transistor random access memory cell structure: (1) a single fluorinated silicon oxide layer of a single thickness serves as both a gate dielectric layer within the field effect transistor device and a capacitor dielectric layer within the metal oxide semiconductor capacitor device; and (2) a channel region within the field effect transistor device has a different threshold voltage adjusting dopant concentration in comparison with a semiconductor plate region within the metal oxide semiconductor capacitor device.

The single transistor random access memory cell structure of the present invention contemplates a method for fabricating the single transistor random access memory cell structure of the present invention.

The present invention provides a single transistor random access memory cell structure, wherein the single transistor random access memory cell structure has enhanced performance.

The present invention realizes the foregoing object within the context of a single transistor random access memory cell structure comprising a field effect transistor device laterally adjoining a metal oxide semiconductor capacitor device, each formed within an active region of a semiconductor substrate, by employing: (1) a single fluorinated silicon oxide layer of a single thickness as both a gate dielectric layer within the field effect transistor device and a capacitor dielectric layer within the metal oxide semiconductor capacitor device; and (2) a channel region within the field effect transistor device with a different threshold voltage adjusting dopant concentration in comparison with a semiconductor plate region within the metal oxide semiconductor capacitor device.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a single transistor random access memory cell structure, wherein the single transistor random access memory cell structure has enhanced performance.

The present invention realizes the foregoing object within the context of a single transistor random access memory cell structure comprising a field effect transistor device laterally adjoining a metal oxide semiconductor capacitor device, each formed within an active region of a semiconductor substrate, by employing: (1) a single fluorinated silicon oxide layer of a single thickness as both a gate dielectric layer within the field effect transistor device and a capacitor dielectric layer within the metal oxide semiconductor capacitor device; and (2) a channel region within the field effect transistor device with a different threshold voltage adjusting dopant concentration in comparison with a semiconductor plate region within the metal oxide semiconductor capacitor device.

While the present invention provides particular value within the context of a single transistor random access memory cell structure comprising a P field effect transistor device having an N channel region and a metal oxide semiconductor capacitor device having an N semiconductor plate region, the invention is not intended to be so limited. Rather the invention is also operative with reverse polarities or alternative polarities of a field effect transistor device and a semiconductor plate region within a metal oxide semiconductor capacitor device.

FIG. 1 to FIG. 6 show a series of schematic cross-sectional diagrams illustrating the results of progressive stages of fabricating a single transistor random access memory cell structure within a semiconductor product in accord with a preferred embodiment of the invention.

Figure 1:
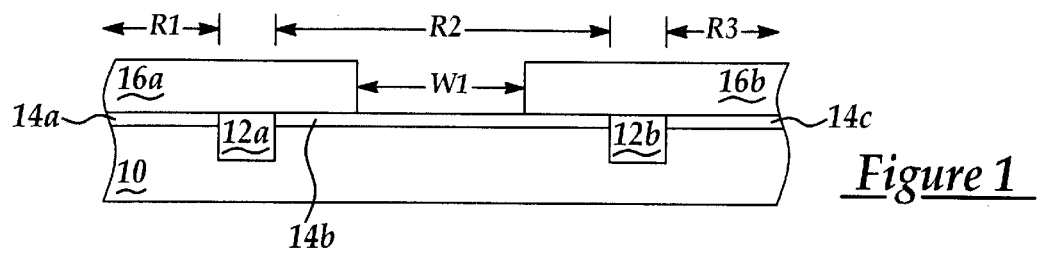
FIG. 1, FIG. 2, FIG. 3, FIG. 4, FIG. 5 and FIG. 6 show a series of schematic cross-sectional diagrams illustrating the results of progressive stages of fabricating a single transistor random access memory cell structure within a semiconductor product in accord with a preferred embodiment of the invention.

FIG. 1 shows a schematic cross-sectional diagram of the semiconductor product at an early stage in its fabrication in accord with the preferred embodiment of the invention.

FIG. 1 shows a semiconductor substrate 10 having formed therein a pair of isolation regions 12a and 12b which define a series of active regions R1, R2 and R3 of the semiconductor substrate 10.

Within the invention, the semiconductor substrate 10 may be formed from any of several semiconductor materials which are susceptible to thermal oxidation to form a gate dielectric layer thereupon. The semiconductor substrate 10 may be of either dopant polarity, several dopant concentrations and various crystallographic orientations. Typically, the semiconductor substrate 10 is formed of a silicon or silicon germanium alloy semiconductor material. More typically, the semiconductor substrate 10 is a (100) silicon semiconductor substrate lightly doped (i.e., from about 1E8 to about 1E10 dopant atoms per cubic centimeter) with N polarity or having a well region lightly doped with N polarity.

Within the invention, the pair of isolation regions 12a and 12b may be formed employing any of several methods as are conventional or unconventional in the semiconductor product fabrication art, including but not limited to trench isolation methods and local oxidation of silicon isolation methods. Typically, the pair of isolation regions 12a and 12b is formed as a pair of shallow trench isolation regions formed at least in part of a silicon oxide material.

Within the invention, the series of active regions R1, R2 and R3 is intended to correspond respectively to: (1) a core region of a semiconductor product within which is formed higher speed logic devices generally requiring field effect transistor devices having particularly thin gate dielectric layers in a range of from about 15 to about 25 angstroms; (2) a single transistor random access memory cell region of the semiconductor product within which is formed field effect transistor devices having gate dielectric layers of thickness from about 26 to about 30 angstroms; and (3) an input/output region having formed therein higher power field effect transistor devices having gate dielectric layers of thickness from about 32 to about 80 angstroms.

FIG. 1 also shows a series of patterned first thermal dielectric layers 14a, 14b and 14c formed upon each of the corresponding active regions R1, R2 and R3 of the semiconductor substrate 10. Finally, FIG. 1 also shows a pair of patterned first masking layers 16a and 16b formed upon the pair of isolation regions 12a and 12b and the series of patterned first thermal dielectric layers 14a, 14b and 14c and defining a first aperture of aperture width W1.

Within the invention, the series of patterned first thermal dielectric layers 14a, 14b and 14c is typically and preferably formed incident to thermal oxidation of the semiconductor substrate 10 at a temperature of from about 750 to about 900 degrees centigrade to provide the series of patterned first thermal dielectric layers 14a, 14b and 14c of silicon oxide of thickness about 45 to about 75 angstroms upon each of the active regions R1, R2 and R3 of the semiconductor substrate 10.

Within the invention, the pair of patterned first masking layers 16a and 16b may be formed from masking materials including but not limited to hard masking materials and photoresist masking materials. Typically, the pair of patterned first masking layers 16a and 16b is formed of a photoresist masking material formed to a thickness of from about 7000 to about 20000 angstroms to define the first aperture of width W1 from about 0.6 to about 1.2 microns.

As is illustrated in FIG. 1, the pair of patterned first masking layers 16a and 16b defines the first aperture above a portion of the active region R2 of the semiconductor substrate within which is desired to fabricate a pair of field effect transistor devices within a pair of single transistor random access memory cell structures. The pair of patterned first masking layers 16a and 16b leaves covered portions of the active region R2 of the semiconductor substrate 10 within which it is desired to form a pair of metal oxide semiconductor capacitor devices which laterally adjoin the pair of field effect transistor devices.

Figure 2:
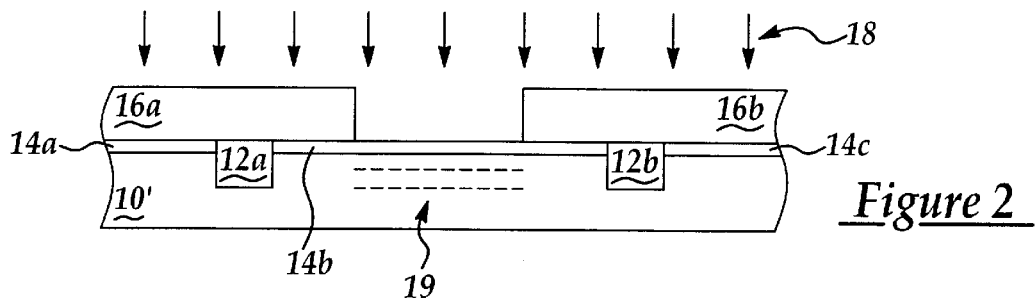

FIG. 2 illustrates the results of further processing of the semiconductor product of FIG. 1.

FIG. 2 illustrates the results of forming a threshold voltage adjusting doped region 19 within the active region R2 of the semiconductor substrate 10 at the location where the pair of field effect transistor devices is to be formed, but not at the location where the pair of metal oxide semiconductor capacitor devices is to be formed. Thus, a once ion implanted semiconductor substrate 10' is formed from the semiconductor substrate 10. The threshold voltage adjusting doped region 19 is typically formed of the same polarity as the once ion implanted semiconductor substrate 10' within which it is formed, while employing the pair of patterned first masking layers 16a and 16b as an ion implantation mask, in conjunction with a dose of first dopant implanting ions 18. Typically, the threshold voltage adjusting doped region 19 is formed having at a dopant concentration of from about 1E16 to about 1E19 dopant atoms per cubic centimeter and to a depth of from about 1000 to about 6000 angstroms within the once ion implanted semiconductor substrate 10', while employing the dose of first dopant implanting ions 18 of dose from about 1E12 to about 1E14 dopant atoms per square centimeter and ion implantation energy of from about 20 to about 100 kev.

Figure 3:
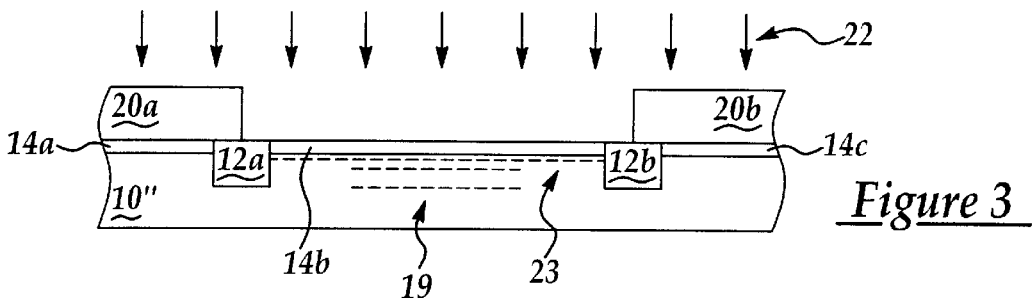

FIG. 3 illustrates the results of further processing of the semiconductor product of FIG. 2.

FIG. 3 first illustrates the results of stripping the pair of patterned first masking layers 16a and 16b from over the once ion implanted semiconductor substrate 10' and then forming thereover a pair of patterned second masking layers 20a and 20b which completely cover the active regions R1 and R3 of the once ion implanted semiconductor substrate 10' but leave completely uncovered the active region R2 of the once ion implanted semiconductor substrate 10'.

Within the invention, the pair of patterned first masking layers 16a and 16b may be stripped employing methods as are conventional in the semiconductor product fabrication art. In addition, the pair of patterned second masking layers 20a and 20b may be formed employing methods, material and dimensions (i.e., other than a lateral separation dimension which leaves completely uncovered the active region R2 of the once ion implanted semiconductor substrate 10') analogous, equivalent or identical to the methods, materials and dimensions employed for forming the pair of patterned first masking layers 16a and 16b.

Finally, FIG. 3 also illustrates a dose of second fluorine implanting ions 22 which is employed for implanting the semiconductor substrate across the surface of the active region R2 such as to provide a fluorine doped surface region 23 therein.

Within the invention, the fluorine doped surface region 23 is formed to a depth of from about 50 to about 200 angstroms within a twice ion implanted semiconductor substrate 10" with a concentration of from about 1E17 to about 1E20 fluorine atoms per cubic centimeter. To achieve the foregoing fluorine doped surface regions 23 dimensions and concentrations, the dose of second fluorine implanting ions 22 is provided at a dose of from about 1E14 to about 1E15 fluorine atoms per square centimeter and an ion implantation energy of from about 5 to about 10 kev.

Figure 4:
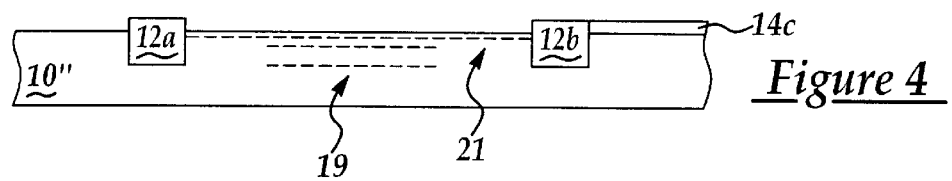

FIG. 4 illustrates the results of further processing of the semiconductor product of FIG. 3.

FIG. 4 illustrates the results of successively stripping from over or upon the twice ion implanted semiconductor substrate 10": (1) the pair of patterned second masking layers 20a and 20b, and then (2) the pair of patterned first thermal dielectric layers 14a and 14b, such as to leave remaining the patterned first thermal dielectric layer 14c.

Within the invention, the pair of patterned second masking layers 20a and 20b may be stripped employing methods and materials analogous, equivalent of identical to the methods and materials employed for stripping the pair of patterned first masking layers 16a and 16b. In addition, the pair of patterned first thermal dielectric layers 14a and 14b may be stripped employing methods and materials, and in particular selectively masked methods and materials, as are conventional in the semiconductor product fabrication art.

Figure 5:
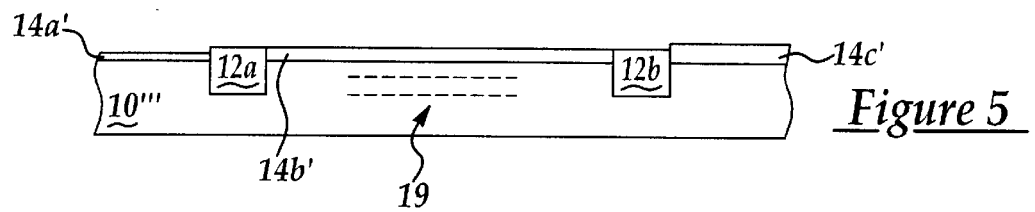

FIG. 5 illustrates the results of further processing of the semiconductor product of FIG. 4.

FIG. 5 shows the results of thermally annealing the twice ion implanted semiconductor substrate 10' as illustrated within FIG. 4 to provide a thermally annealed twice ion implanted semiconductor substrate 10'" having formed thereupon a series of patterned second thermal dielectric layers 14a', 14b' and 14c' formed incident to thermal oxidation of the twice ion implanted semiconductor substrate 10".

Within the invention, the twice ion implanted semiconductor substrate 10' is thermally annealed and oxidized at a temperature of from about 650 to about 750 degrees centigrade for a time period of from about 30 to about 120 minutes to provide the thermally annealed twice ion implanted semiconductor substrate 10'" having formed thereupon the series of patterned second thermal dielectric layers 14a', 14b, and 14c, (each formed of a separate thickness within a single thermal annealing method) within the corresponding active regions R1, R2 and R3.

Within the invention, the patterned second thermal dielectric layer 14a' is typically formed to a thickness of from about 15 to about 25 angstroms, typically as a purely silicon oxide dielectric material. Typically, patterned second thermal dielectric layer 14b' is formed to a thickness of from about 26 to about 30 angstroms, since fluorine implantation into the semiconductor substrate 10 provides for an enhanced thermal oxidation rate. Due to the presence of the fluorine doped surface region 23, the patterned second thermal oxide layer 14b' is also formed as a fluorinated silicon oxide material. Typically, the patterned second thermal dielectric layer 14c' is formed to a thickness of from about 45 to about 75 angstroms due to an additional incremental thickness formed incident to thermal oxidation of the patterned first thermal dielectric layer 14c.

Figure 6:
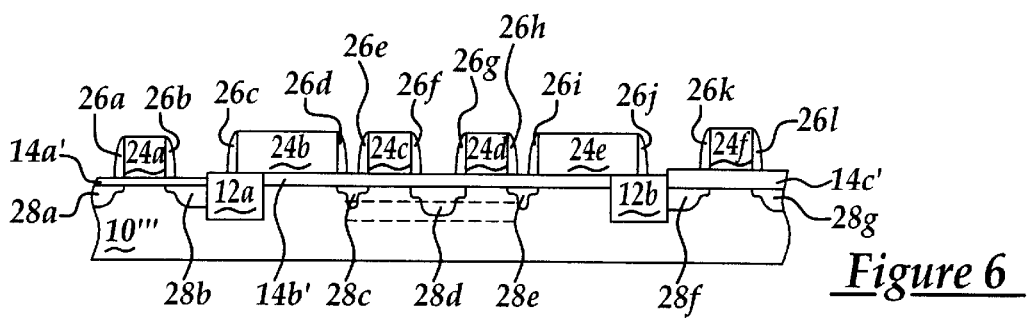

FIG. 6 shows the results of further processing of the semiconductor product of FIG. 5.

FIG. 6 shows the results of forming within the first region R1 and the third region R3 of the semiconductor substrate a pair of field effect transistor devices. The pair of field effect transistor devices comprises: (1) a pair of gate electrodes 24a and 24f formed upon the corresponding pair of patterned second thermal dielectric layers 14a' and 14c' (which serve as gate dielectric layers); (2) a series of spacer layers 26a, 26b, 26k and 26l formed adjoining a pair of opposite sidewalls of the pair of gate electrodes 24a and 24f; and (3) a series of source/drain regions 28a, 28b, 28f and 28g formed into the first region R1 and the third region R3 of the thermally annealed twice ion implanted semiconductor substrate 10'" at areas not covered by the pair of gate electrodes 24a and 24f.

Typically, the pair of gate electrodes is formed of a doped polysilicon material formed to a thickness of from about 1500 to about 3000 angstroms, although other materials may also bee employed. Typically, the series of spacer layers 26a, 26b, 26k and 26l is formed of a silicon nitride containing material. Typically, each of the source/drain regions 28a, 28b, 28f and 28g is formed employing a two step ion implant method, of appropriate polarity, as is conventional within the semiconductor product fabrication art.

FIG. 6 also shows a pair of field effect transistor devices formed laterally adjoining a pair of metal oxide semiconductor capacitor devices, all formed within the active region R2 of the thermally annealed twice ion implanted semiconductor substrate 10'". The pair of field effect transistor devices comprises: (1) a pair of gate electrodes 26c and 26d: (2) a series of spacer layers 26e, 26f, 26g and 26h adjoining a pair of opposite sidewalls of the pair of gate electrodes 24c and 24d; and (3) a series of source/drain regions 28c, 28d and 28e formed within the active region R2 of the thermally annealed twice ion implanted semiconductor substrate 10'". The pair of metal oxide semiconductor capacitors comprises: (1) a pair of portions of the thermally annealed twice ion implanted semiconductor substrate 10'" absent the threshold voltage adjusting dopant region 19 as semiconductor capacitor plate regions; and (2) a pair of patterned upper capacitor plate layers 24b and 24c.

Correlating component structures within the pair of field effect transistor devices and the pair of metal oxide semiconductor devices are formed simultaneously with the pair of field effect transistor devices formed within the active regions R1 and R3 of the thermally annealed twice ion implanted semiconductor substrate 10'".

Within the invention, the patterned second thermal dielectric layer 14b', which is formed of the fluorinated silicon oxide material, serves as a single thickness layer which provides both: (1) a gate dielectric layer within the pair of field effect transistor devices; and (2) a capacitor dielectric layer within the pair of metal oxide semiconductor capacitor devices, within the active region R2 of the thermally annealed twice ion implanted semiconductor substrate.

Thus, within the invention, the pair of field effect transistor devices within the active region R2 is formed with a different threshold voltage in comparison with the pair of metal oxide semiconductor capacitor devices within the active region R2, since the threshold voltage adjusting doped region 19 is localized to the pair of field effect transistor devices and not the pair of metal oxide semiconductor capacitor devices.

Within the invention when employing: (1) a P field effect transistor device having an N dopant channel region; and (2) a metal oxide semiconductor capacitor device having an N semiconductor capacitor plate region, the foregoing fluorine concentration within the patterned second thermal dielectric layer 14b' provides for an increase in threshold voltage for the pair of metal oxide semiconductor capacitor devices (and pair of field effect transistor devices) from a base value (for a silicon oxide capacitor dielectric layer) of −0.47 volts to a more positive value of −0.30 volts. Such a decreased negative voltage suppresses leakage within the pair of metal oxide semiconductor capacitor devices. In addition, the threshold adjusting voltage region 19 provides a recovery of the threshold voltages of the pair of field effect transistor devices to about −0.38 to about −0.40 volts, thus providing reduced sub-threshold leakage within the pair of field effect transistor devices. Thus, the invention provides a single transistor random access memory cell structure with enhanced performance with respect to both a field effect transistor device and a metal oxide semiconductor capacitor device formed therein.

As is understood by a person skilled in the art, the preferred embodiment of the invention is illustrative of the invention rather than limiting of the invention. Revisions and modifications may be made to methods, materials, structures and dimensions in accord with the preferred embodiment of the invention while still providing a semiconductor product in accord with the invention, and a method for fabrication thereof, further in accord with the accompanying claims.

What is claimed is:

1. A random access memory cell comprising:
    a semiconductor substrate having a minimum of one active region defined therein;
    a field effect transistor device laterally adjoining a metal oxide semiconductor capacitor device, each formed within the minimum of one active region, wherein:
        a single fluorinated dielectric layer of a single thickness serves as both a gate dielectric layer within the field effect transistor device and a capacitor dielectric layer within the metal oxide semiconductor capacitor device; and
        a channel region within the field effect transistor device has a different threshold adjusting dopant concentration in comparison with a semiconductor plate region within the metal oxide semiconductor capacitor device.

2. The random access memory cell of claim 1 wherein the single fluorinated silicon oxide layer is formed incident to oxidation of a semiconductor substrate having a fluorine doped surface layer at a concentration of from about 1E17 to about 1E20 fluorine atoms per cubic centimeter.

3. The random access memory cell of claim 1 wherein the channel region within the field effect transistor device has a threshold adjusting dopant concentration of from about 1E16 to about 1E19 dopant atoms per cubic centimeter.

4. The random access memory cell of claim 1 wherein the channel region within the field effect transistor device and a semiconductor plate region within the metal oxide semiconductor capacitor device are formed of the same polarity.

5. The random access memory cell of claim 1 further comprising an additional pair of field effect transistor devices formed within the semiconductor substrate, each having a non fluorinated silicon oxide layer as a gate dielectric layer, one thicker and one thinner than the single fluorinated silicon oxide layer.

6. A method for fabricating a random access memory cell comprising:
    providing a semiconductor substrate having a minimum of one active region defined therein;
    forming a field effect transistor device laterally adjoining a metal oxide semiconductor capacitor device, each formed within the minimum of one active region, wherein:
        a single fluorinated dielectric layer of a single thickness serves as both a gate dielectric layer within the field effect transistor device and a capacitor dielectric layer within the metal oxide semiconductor capacitor device; and
        a channel region within the field effect transistor device has a different threshold adjusting dopant concentration in comparison with a semiconductor plate region within the metal oxide semiconductor capacitor device.

7. The method of claim 6 wherein the single fluorinated silicon oxide layer is formed incident to oxidation of a semiconductor substrate having a fluorine doped surface layer at a concentration of from about 1E17 to about 1E20 fluorine atoms per cubic centimeter.

8. The method of claim 6 wherein the channel region within the field effect transistor device has a threshold adjusting dopant concentration of from about 1E16 to about 1E19 dopant atoms per cubic centimeter.

9. The method of claim 6 wherein the channel region within the field effect transistor device and a semiconductor plate region within the metal oxide semiconductor capacitor device are formed of the same polarity.

10. The method of claim 6 further comprising forming an additional pair of field effect transistor devices within the semiconductor substrate, each having a non fluorinated silicon oxide layer as a gate dielectric layer, one thicker and one thinner than the single fluorinated silicon oxide layer.

* * * * *